(12) United States Patent
Reber et al.

(10) Patent No.: US 9,122,812 B2
(45) Date of Patent: Sep. 1, 2015

(54) SEMICONDUCTOR DEVICE WITH VIAS ON A BRIDGE CONNECTING TWO BUSES

(71) Applicant: FREESCALE SEMICONDUCTOR, INC., Austin, TX (US)

(72) Inventors: Douglas M. Reber, Austin, TX (US); Mehul D. Shroff, Austin, TX (US); Edward O. Travis, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/284,950

(22) Filed: May 22, 2014

(65) Prior Publication Data

US 2014/0258582 A1  Sep. 11, 2014

Related U.S. Application Data

(62) Division of application No. 13/285,073, filed on Oct. 31, 2011, now Pat. No. 8,736,071.

(51) Int. Cl.
*H01L 23/528* (2006.01)
*G06F 13/40* (2006.01)
*G06F 17/50* (2006.01)
*H01L 23/522* (2006.01)

(52) U.S. Cl.
CPC ........ *G06F 13/4027* (2013.01); *G06F 17/5077* (2013.01); *H01L 23/528* (2013.01); *H01L 23/5283* (2013.01); *H01L 23/5286* (2013.01); *H01L 23/5221* (2013.01)

(58) Field of Classification Search
CPC .............. H01L 23/528; H01L 23/5221; H01L 23/5283; H01L 23/5286
See application file for complete search history.

(56) References Cited

U.S. PATENT DOCUMENTS

| | | |
|---|---|---|
| 5,439,731 A | 8/1995 | Li et al. |
| 5,581,475 A | 12/1996 | Majors |
| 5,930,587 A | 7/1999 | Ryan |
| 6,823,500 B1 | 11/2004 | Ganesh et al. |
| 6,972,209 B2 | 12/2005 | Agarwala et al. |
| 7,253,531 B1 | 8/2007 | Huang et al. |
| 7,915,733 B2 | 3/2011 | Kudo |
| 2006/0154470 A1 | 7/2006 | Pozder et al. |

(Continued)

OTHER PUBLICATIONS

Huang et al, "Numerical Modeling and Characterization of the Stress Migration Behavior Upon Various 90 nanometer Cu/Low k Interconnects", Interconnect Technology Conference, 2003, pp. 207-209.

(Continued)

*Primary Examiner* — Amar Movva

(57) ABSTRACT

A semiconductor device comprises conductive buses and conductive bridges. A respective conductive bridge is conductively coupled to at least two portions of at least one of the conductive buses. At least N plus one (N+1) vias are coupled between every one of the conductive bridges and a respective feature in an integrated circuit when: (1) a width of the respective conductive bridge is less than a width of each of the at least two portions of the at least one of the conductive buses to which the respective conductive bridge is coupled, and (2) a distance along the respective conductive bridge and at least one of the vias is less than a critical distance. N is a number of conductive couplings between the respective one of the conductive bridges and the at least one of the conductive buses.

20 Claims, 2 Drawing Sheets

(56) References Cited

U.S. PATENT DOCUMENTS

2008/0121881 A1     5/2008    Kaneko et al.
2010/0257502 A1   10/2010   Matsuoka

OTHER PUBLICATIONS

Luo et al, "Yield-Preferred Via Insertion Based on Novel Geotopological Technology", IEEE, Aug. 2006, pp. 730-735.

Ogawa et al, "Stress-Induced Voiding Under Vias Connected to Wide Cu Metal Leads", 40th Annual International Reliability Physics Symposium, Dallas TX, Sep. 2002, pp. 312-321.

U.S. Appl. No. 13/285,073, Office Action, mailed Jan. 31, 2013.

U.S. Appl. No. 13/285,073, Office Action—Rejection, Mailed Jul. 3, 2013.

U.S. Appl. No. 13/285,073, Office Action mailed Jan. 16, 2014.

U.S. Appl. No. 13/313,179, Mehul D. Shroff, et al., "Method of Protecting Against Via Failure and Structure Therefor", filed Dec. 7, 2011, Office Action—Rejection, mailed Oct. 3, 2012.

U.S. Appl. No. 13/313,179, Mehul D. Shroff, et al., "Method of Protecting Against Via Failure and Structure Therefor", filed Dec. 7, 2011, Office Action—Final Rejection, mailed Apr. 12, 2013.

U.S. Appl. No. 13/313,179, Office Action—Final Rejection, mailed Aug. 15, 2013.

U.S. Appl. No. 13/313,179, Office Action—Rejection, mailed Jun. 16, 2014.

U.S. Appl. No. 13/313,179, Office Action—Allowance, mailed Sep. 15, 2014.

SEMICONDUCTOR DEVICE WITH VIAS ON A BRIDGE CONNECTING TWO BUSES

BACKGROUND

1. Field

This disclosure relates generally to semiconductor devices, and more specifically, to vias on a bridge connecting two buses.

2. Related Art

Semiconductor devices often have parallel lines that are connected by a bridge. The lines are often considered buses because they are relatively wide for low resistance so as to be able to carry relatively high currents without causing problematic voltage drop. For a given technology, the depth of the lines at a given metal level is the same so that width is the variable in determining resistance per unit of length. Increasing width reduces resistance, but requires more area as well as increasing the risk of voiding at the vias. The stress can result in a variety of failures including via failure. Although via failures may have a low probability of occurring, there are often millions of vias on a given semiconductor device. The result is that a likelihood of at least one via failure is relatively high. Thus, it has become common to provide redundant vias with the view that it is unlikely that two vias will fail at the same location. This has been effective, but as geometries continue to shrink, via failures, even at redundant via locations, continue to occur.

Accordingly, there is a need for further improvement in reducing via failures.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, in a conductive line that is relatively wide, often referenced as a bus, there are vacancies that are formed which later tend to accumulate at features, such as corners and vias, that are formed along sides of the buses. The depth at a given metal level is fixed so that the variable that determines the number of vacancies available for diffusion is width. For the buses, which are relatively wide, there are generally more vacancies formed that ultimately accumulate at the features that are formed in narrow lines. If there is a via at the feature and the via is sufficiently close to the side of the bus, the via can be caused to fail due to the vacancy accumulation at the via which results in voiding of the via or in the metal below the via. For a bridge that connects two buses, vacancies approach from both buses and thus potentially attack the via from both sides. By placing three vias, and potentially more, on the bridge, the two vias closest to the buses are attacked by the vacancies and may fail, but the center via or vias are not attacked by the vacancies because the vacancies are absorbed by the vias closest to the buses. This is better understood by reference to the drawings and the following written description.

Figure 1:
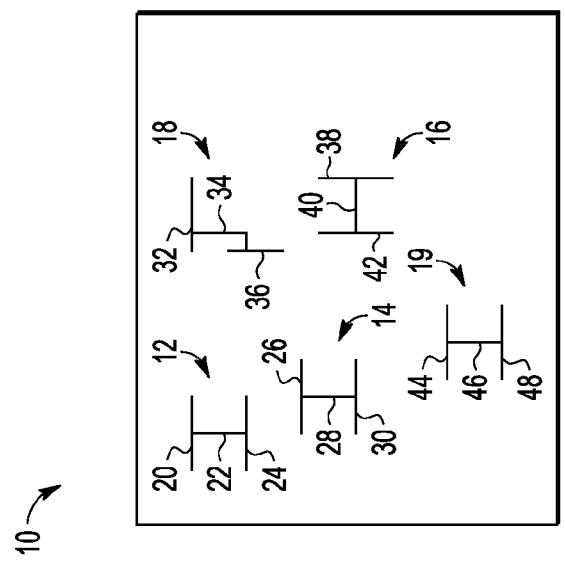
FIG. 1 is a top view of a semiconductor device depicting a plurality of pairs of buses connected with bridges.

Shown in FIG. 1 is an integrated circuit 10 that may be referenced as a semiconductor device 10 comprising a connected pair 12, a connected pair 14, a connected pair 16, and a connected pair 18. Semiconductor device 10 has many transistors and other features not shown. Connected pair 12 has a bus 20, a bridge 22, and a bus 24 coupled to bus 20 through bridge 22. Bus 20 is parallel to bus 24. Connected pair 14 has a bus 26, a bridge 28, and a bus 30 coupled to bus 26 through bridge 28. Bus 26 is parallel to bus 30. Connected pair 16 has a bus 38, a bridge 40, and a bus 42 coupled to bus 38 through bridge 40. Bus 38 is parallel to bus 42. Connected pair 18 has a bus 32, a bridge 34, and a bus 36 coupled to bus 32 through bridge 34. Bus 32 is not parallel to bus 36. Connected pair 19 has a bus 44, a bridge 46, and a bus 48 coupled to bus 44 through bridge 46. Buses 44 and 48 are parallel to each other. Connected pairs, 12, 14, 16, 18, and 19 are exemplary connected pairs of the many more that are present on semiconductor device 10. All of the buses of the connected pairs, in this example, are on the same conductor level but could be on different metal layers. The conductor level may be made primarily of copper and all of the buses have the same depth.

Figure 2:
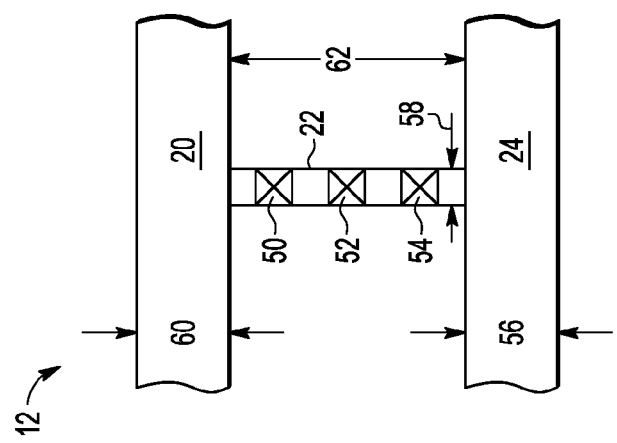
FIG. 2 is a top view of a first pair of the plurality of pairs of buses connected with a bridge having vias, wherein the first pair are parallel.

Shown in FIG. 2 is connected pair 12 showing vias 50, 52, and 54 on bridge 22. Bus 20 has a width 60. Bus 24 has a width 56. Bridge 22 has a width 58. Widths 56 and 60 are both wider than width 58. A distance between buses 20 and 24 is a distance 62. Although not necessarily the case, vias 50, 52, and 54 span the width of bridge 22. Buses 20 and 24 are much wider; which may be 5 times or greater, than bridge 22. Any bridge with a width less than the buses it connects is considered to be a risk for deleterious vacancy migration. With bridge 22 being formed as part of the same conductor level as buses 20 and 24, there would not be a visible line where bridge 22 joins buses 20 and 24 although such line is provided in FIG. 2 for clarity in identifying bridge 22.

Figure 3:
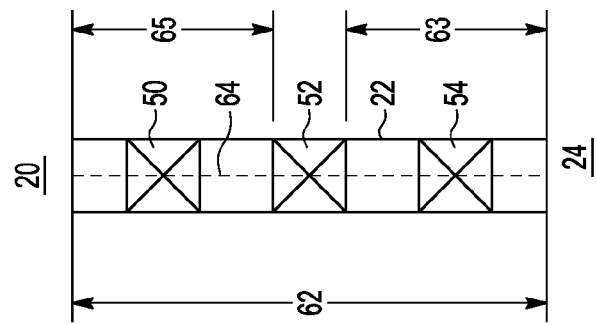
FIG. 3 is a top view of a portion of the first pair and its bridge.

Shown in FIG. 3 is a closer view of vias 50, 52, and 54 showing a bus centerline 64 extending through 50, 52, and 54 from bus 20 to bus 24. A distance from bus 20 to via 52 is a distance 65. A distance from bus 24 to via 52 is a distance 63. Via 52 is at risk of being corrupted by being too close to buses 20 and 24 based on the widths of buses 20 and 24 as well as other factors such as heat cycles and the particular material or materials that comprise buses 20 and 24. For a given process the depth and heat cycles and most other conditions would be fixed so that width may be the only selectable variable relative to buses 20 and 24. Also a bridge width, distance 58, may be a selectable variable. A distance from a bus to a via at which the via is considered to be at risk due to migration of vacancies from the bus may be called a critical distance. Thus, if a via on a bridge is further away from the bus than the critical distance, the via is considered safe relative to that bus. As for bridge 22, distances 63 and 65 are less than the critical distance so via 52 is at risk relative to both bus 20 and bus 24. To prevent either bus 20 or bus 24 from causing via 52 to fail, vias 50 and 54 are placed between via 52 and bus 20 and between via 52 and bus 24, respectively. Alternatively, the placement of via 52 may be viewed as protecting the connection from failure if vias 50 and 54 fail due to stress migration. By placing the via further way from the intersection, it is less prone to failure. Vacancy migration is thus distributed between at vias 50, 52, and 54. Vias 50 and 54 may fail because they accumulate more vacancies, but via 52 would be protected from the vacancy migration and thus avoid forming a void and consequently failing. This may also be described as a case in which a via, via 52, is placed at a distance greater than a first critical distance on the bus 20 side and a second critical distance on the bus 24 side. The first critical distance takes into account the width of bus 20 and the second critical distance takes into account the width of bus 24. Another factor relative to determining a critical distance is the proximity of bridge 22 to other bridges forming the same electrical connection as the vias on bridge 22 that may be connected to buses 20 and 24. If other bridges containing vias are close to bridge 22, then the migrating vacancies may be spread among the bridges which would increase the critical distance.

Connected pair 14 is the same as connected pair 12 and connected pair 16 is substantially the same as connected pair 12. In the case of connected pair 16, buses 38 and 42 run orthogonal to the buses of connected pairs 12 and 14. In each of these three cases then, each connected pair has a bridge with three vias because the center via of the three is within the critical distance to each of the adjacent buses. In the case of connected pair 14, bridge 28 has three vias in which the center one is within the critical distance to bus 26 and the critical distance to bus 30. In the case of connected pair 16, bridge 40 has three vias in which the center one is within the critical distance to bus 38 and the critical distance to bus 42. Additionally, in all of these cases, more vias can be placed on the bridges if sufficient space exists in order to further improve the robustness of the connection and protect it from failure.

Figure 4:
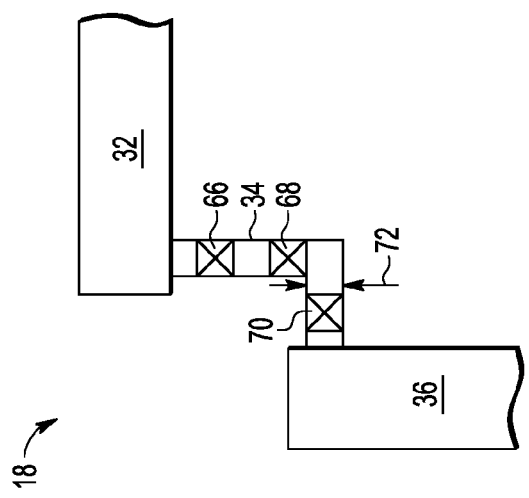
FIG. 4 is a top view of second first pair of the plurality of pairs of buses connected with a bridge having vias, wherein the buses of the second pair are not parallel.

Shown in FIG. 4 is connected pair 18 showing vias 66, 68, and 70 in bridge 34. Buses 32 and 36 are not parallel and shown at right angles to each other. Accordingly bridge 34 is not a straight line. Via 68 is the center via in which via 66 is on the bus 32 side of bridge 34 and via 70 is on the bus 36 side of bridge 34.

Figure 5:
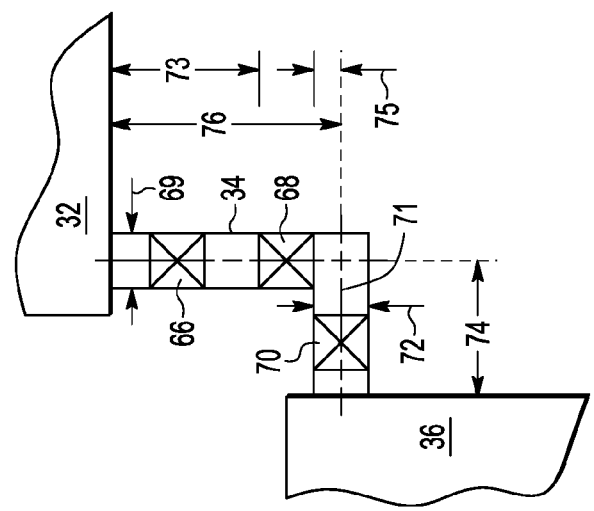
FIG. 5 is a top view of a portion of the second pair and its bridge.

Shown in FIG. 5 is a portion of connected pair 18 showing a center line 71 that extends laterally in FIG. 5 from bus 36 to a distance 74 then vertically to bus 32 a distance 76. Via 68, the center via, is at a distance 73 from bus 32. The lateral portion of bridge 34 has a width 72. The vertical portion of bridge 34 has a width 69. Widths 69 and 72 may be the same or different and thus affect the critical distance a little differently. For simplicity it may advantageous to simply base the decision to add vias on whether the bridge is narrower than the buses. The actual width may not need to be taken into account. Distance 73 is less than the critical distance to bus 32. Via 66 being between via 68 and bus 32 protects via 68 so that it remains good. Via 68 is at a distance 75 vertically from the lateral portion of center line 71. The sum of distance 74 plus distance 75 is less than the critical distance for this situation so that via 70 is provided on bridge 34 between via 68 and bus 36 to protect via 68 with the result that via 68 remains good. Alternatively, by placing via 68 further away from buses 32 and 36 than vias 66 and 70, respectively, it is less prone to failure and therefore can better preserve the integrity of the connection.

Figure 6:
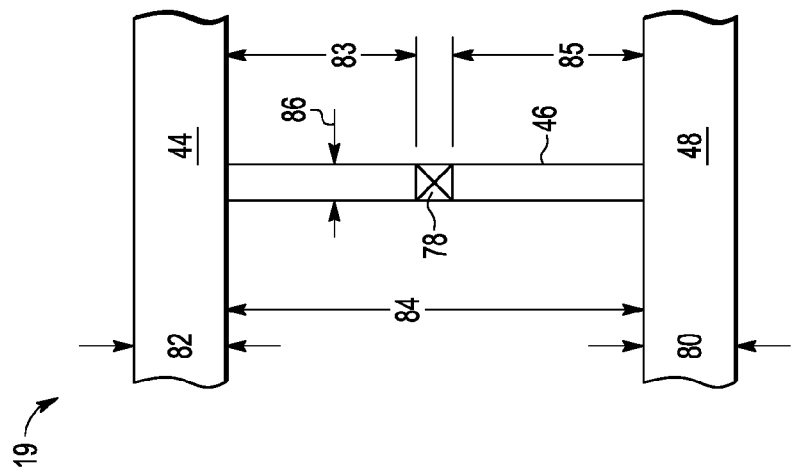
FIG. 6 is a top view of a third pair of the plurality of pairs of buses connected with a bridge having a single via.

Shown in FIG. 6 is connected pair 19 showing a via 78 in a center portion of bridge 46. The distance between buses 44 and 48 is a distance 84. A distance from bus 44 to via 78 is a distance 83. A distance from bus 48 to via 78 is a distance 85. In this case distance 85 exceeds the critical distance to bus 48 so that no additional via is required between bus 48 and via 78. Similarly, distance 83 exceeds the critical distance to bus 44 so that no additional via is required between bus 44 and via 78.

The approach described may be implemented as a design rule. For each via in a bridge between two buses, a critical distance is calculated to each bus. The result is at least three vias on the bridge every time the distance from the middle via to each bus is less than the critical distance to both buses. The calculation of the critical distance may be simplified by categorizing the different types of bus structures and using a look up table based on, for example, the bus width. Bridge width, for simplicity, may not have to be taken into account. Although not expected to happen except sometimes in the case of buses in different layers, it could happen that the depths of the buses may vary in which case the depth would have to be taken into account in calculating the critical distance to the via. Critical distance would be expected to include some margin knowing there would be process variations that would affect width and depth of the bus, for example. Other variations could also play a role in the need for margin in providing the critical distance. This could also affect the minimum bridge distance. It may be necessary to have a bridge length that can accommodate three vias. Also, in such case of minimum bridge length, it is likely that three vias will always be required and thus saving a separate determination. A possible simplification may simply be a determination of the bridge length. If the length is less than some amount, two vias are added. Also, it may be that there are so few situations in which the bridge length is sufficient to avoid adding vias that all bridges are made to have three vias.

By now it should be appreciated that there has been provided a semiconductor device including conductive buses, second conductive buses, and conductive bridges. Every conductive bridge is coupled between a respective one of the first and second conductive buses that has a width that is less than widths of the first and second conductive buses includes at least three conductive vias coupled between the respective conductive bridge and a respective feature in the integrated circuit, wherein a first distance along a respective one of the conductive bridges between an edge of one of the vias and the first bus is less than a respective first critical length, and a second distance along the respective one of the conductive bridges between an edge of one of the vias and the second bus is less than a respective second critical length. The semiconductor device may have a further characterization by which the respective one of the first conductive buses has a first length, the respective one of the second conductive buses has a second length, and at least one of the first and second lengths is greater than a predetermined length. The semiconductor device may have a further characterization by which at least one of the vias is located at a distance along the respective one of the conductive bridges that is greater than a respective critical distance from the respective one of the first and second conductive buses. The semiconductor device may further includes N number of conductive couplings between a respective one of the bridges and the respective one of the first and second conductive buses and at least N plus one (N+1) vias coupled between the respective one of the bridges and the respective feature in the integrated circuit. The semiconductor device may have a further characterization by which. The semiconductor device may have a further characterization by which at least one of the group consisting of a volume of the respective one of the first conductive buses is greater than a respective first threshold volume which will cause stress migration in at least one of the vias and a volume of the respective one of the second conductive buses is greater than a respective second threshold volume which will cause stress migration in at least one of the vias. The semiconductor device may have a further characterization by which at least one of the group consisting of an area of the respective one of the first conductive buses is greater than a first threshold area which will cause stress migration in at least one of the vias and an area of the respective one of the second conductive buses is greater than a second threshold area which will cause stress migration in at least one of the vias. The semiconductor device may have a further characterization by which at least one of the group consisting of the first respective critical length is determined based on at least one of the first width and a first length of the respective first conductive bus and the second respective critical length is determined based on at least one of the second width and a second length of the respective second conductive bus. The semiconductor device may have a further characterization by which one of the respective first conductive buses is in a first layer of the integrated circuit and one of the respective second conductive buses is in a second layer of the integrated circuit. The semiconductor device may have a further characterization by which the ones of the respective first and second conductive buses are in a same layer of the integrated circuit.

Also described is a semiconductor device having conductive buses and conductive bridges and at least N plus one (N+1) vias. A respective conductive bridge is conductively coupled to at least two portions of at least one of the conductive buses. The at least N plus one (N+1) vias coupled between every one of the conductive bridges and a respective feature in an integrated circuit when a width of the respective conductive bridge is less than a width of each of the at least two portions of the at least one of the conductive buses to which the respective conductive bridge is coupled and a distance along the respective conductive bridge to at least one of the vias is less than a critical distance. N is a number of conductive couplings between the respective one of the conductive bridges and the at least one of the conductive buses. The semiconductor device may have a further characterization by which the respective conductive bridge is coupled between a pair of the conductive buses, one of the conductive buses in the pair of the conductive buses is in a first layer of the integrated circuit, and another one of the conductive buses in the pair of the conductive buses is in a second layer of the integrated circuit. The semiconductor device may have a further characterization by which at least one of the pairs of the conductive buses are in a same layer of the integrated circuit. The semiconductor device may have a further characterization by which at least one of the vias is located at a distance along the respective conductive bridges that is greater than a critical distance from a nearest edge of the at least one of the conductive buses. The semiconductor device may have a further characterization by which a first distance along the respective conductive bridge between an edge of a respective one of the vias and the first portion of the at least one of the buses is less than a respective first critical length, and a second distance along the respective conductive bridge between an edge of a respective one of the vias and the second portion the at least one of the buses is less than a respective second critical length, the first respective critical length is determined based on at least one of the width and a length of the first portion of the at least one of the buses, and the second respective critical length is determined based on at least one of the width and a length of the second portion of the at least one of the buses. The semiconductor device may have a further characterization by which one section of the at least one of the conductive buses adjacent to one of the at least two portions has a first length, another section of the at least one of the conductive buses adjacent to another one of the at least two portions has a second length, and at least one of the first and second lengths is greater than a predetermined length. The semiconductor device may have a further characterization by which at least one of the group consisting of an area of the at least one of the conductive buses is greater than a first threshold area which will cause stress migration in at least one of the vias and another area of the at least one of the conductive buses in the pair of the conductive buses is greater than a second threshold area which will cause stress migration in at least one of the vias.

Described also is a method for determining placement of vias in a semiconductor device on conductive bridges. For every conductive bridge in the semiconductor device, determining a width of a first conductive bus, determining a width of a second conductive bus, and determining a width of a conductive bridge coupled between the first and second conductive buses. When the width of the conductive bridge is less than the width of the first or second conductive buses, forming at least three vias coupled between the conductive bridge and another feature in the semiconductor device to reduce stress migration from at least one of the first and second conductive buses and one of the vias, wherein at least one of the vias is positioned a distance along the conductive bridge that is greater than a critical distance. The method may further include determining whether a volume of the first conductive bus is greater than a first threshold volume which will cause stress migration in at least one of the vias and determining whether a volume of the second conductive bus is greater than a second threshold volume which will cause stress migration in at least one of the vias. The method may further include determining whether an area of the first conductive bus is greater than a first threshold area which will cause stress migration in at least one of the vias and determining whether an area of the second conductive bus is greater than a second threshold area which will cause stress migration in at least one of the vias. The method may further include determining the critical distance based on at least one of the width and a length of one of the first and second conductive buses.

Although the invention is described herein with reference to specific embodiments, various modifications and changes can be made without departing from the scope of the present invention as set forth in the claims below. For example, there may benefits to having more than three vias on a bridge. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for determining placement of vias in a semiconductor device comprising:
   for a conductive bridge in the semiconductor device:
   determining a width of a first conductive bus;
   determining a width of a second conductive bus;
   determining a width of the conductive bridge, wherein the conductive bridge is coupled between the first and second conductive buses; and
   when the width of the conductive bridge is less than the width of the first conductive bus and the width of the second conductive bus, forming three conductive vias in the conductive bridge,
   wherein a middle via of the three conductive vias is positioned a first distance along the conductive bridge from the first conductive bus that is greater than a first vacancy migration critical distance, and wherein the middle via of the three conductive vias is positioned a second distance along the conductive bridge from the second conductive bus that is greater than a second vacancy migration critical distance.

2. The method of claim 1 further comprising:
   determining whether a volume of the first conductive bus is greater than a first threshold volume which will cause stress migration in at least one of the three conductive vias.

3. The method of claim 1 further comprising:
   determining whether an area of the first conductive bus is greater than a first threshold area which will cause stress migration in at least one of the three conductive vias.

4. The method of claim 1 further comprising:
   determining the first critical distance based on at least one of the width and a length of of the first conductive bus.

5. The method of claim 1 further comprising:
   determining whether a volume of the second conductive bus is greater than a second threshold volume which will cause stress migration in at least one of the three conductive vias.

6. The method of claim 1 further comprising:
   determining whether an area of the second conductive bus is greater than a second threshold area which will cause stress migration in at least one of the three conductive vias.

7. The method of claim 1 further comprising:
   determining the second critical distance based on at least one of the width and a length of one of the second conductive bus.

8. The method of claim 1 wherein
   the first conductive bus has a first length,
   the second conductive bus has a second length, and
   at least one of the first length and the second length is greater than a predetermined length.

9. The method of claim 1 wherein
   the first conductive bus is in a first layer of an integrated circuit, and
   the second conductive bus is in a second layer of the integrated circuit.

10. The method of claim 1 wherein
    the first conductive bus and the second conductive bus are in a same layer of an integrated circuit.

11. A method for determining placement of vias in a semiconductor device comprising:
    for a conductive bridge in the semiconductor device:
    determining a width of a first conductive bus;
    determining a width of a second conductive bus;
    determining a width of the conductive bridge, wherein the conductive bridge is conductively coupled to the first and second conductive buses; and
    when the width of the conductive bridge is less than the width of the first conductive bus and the width of the second conductive bus, forming three conductive vias in the conductive bridge,
    wherein a middle via of the three conductive vias is positioned a first distance along the conductive bridge from the first conductive bus that is less than a first vacancy migration critical distance, and wherein the middle via is positioned a second distance along the conductive bridge from the second conductive bus that is less than a second vacancy migration critical distance.

12. The method of claim 11 further comprising:
    determining whether a volume of the first conductive bus is greater than a first threshold volume which will cause stress migration in at least one of the three conductive vias.

13. The method of claim 11 further comprising:
    determining whether an area of the first conductive bus is greater than a first threshold area which will cause stress migration in at least one of the three conductive vias.

14. The method of claim 11 further comprising:
    determining the first critical distance based on at least one of the width and a length of the first conductive bus.

15. The method of claim 11 further comprising:
    determining whether a volume of the second conductive bus is greater than a second threshold volume which will cause stress migration in at least one of the three conductive vias.

16. The method of claim 11 further comprising:
    determining whether an area of the second conductive bus is greater than a second threshold area which will cause stress migration in at least one of the three conductive vias.

17. The method of claim 11 further comprising:
    determining the second critical distance based on at least one of the width and a length of one of the second conductive bus.

18. The method of claim 11 wherein
    the first conductive bus has a first length,
    the second conductive bus has a second length, and
    at least one of the first length and the second length is greater than a predetermined length.

19. The method of claim 11 wherein
    the first conductive bus is in a first layer of an integrated circuit, and
    the second conductive bus is in a second layer of the integrated circuit.

20. The method of claim 11 wherein
    the first conductive bus and the second conductive bus are in a same layer of an integrated circuit.

* * * * *